United States Patent
Yoon

(10) Patent No.: US 9,679,671 B2
(45) Date of Patent: Jun. 13, 2017

(54) LOW OHMIC LOSS RADIAL SUPERLATTICE CONDUCTORS

(71) Applicant: University of Florida Research Foundation, Gainesville, FL (US)

(72) Inventor: Yong-Kyu Yoon, Gainesville, FL (US)

(73) Assignee: UNIVERSITY OF FLORIDA REASEARCH FOUNDATION, INC., Gainesville, FL (US)

( * ) Notice: Subject to any disclaimer, the term of this patent is extended or adjusted under 35 U.S.C. 154(b) by 0 days.

(21) Appl. No.: 14/904,457

(22) PCT Filed: Jul. 11, 2014

(86) PCT No.: PCT/US2014/046299
§ 371 (c)(1),
(2) Date: Jan. 12, 2016

(87) PCT Pub. No.: WO2015/006660
PCT Pub. Date: Jan. 15, 2015

(65) Prior Publication Data
US 2016/0148714 A1 May 26, 2016

Related U.S. Application Data

(60) Provisional application No. 61/845,488, filed on Jul. 12, 2013.

(51) Int. Cl.
*H01B 1/02* (2006.01)
*H01B 7/30* (2006.01)
(Continued)

(52) U.S. Cl.
CPC ............. *H01B 1/02* (2013.01); *H01B 7/30* (2013.01); *H01B 11/18* (2013.01);
(Continued)

(58) Field of Classification Search
CPC ... H01B 1/00; H01B 1/02; H01B 7/30; H01B 11/18; H01L 23/66
See application file for complete search history.

(56) References Cited

U.S. PATENT DOCUMENTS

| 3,451,793 A | 6/1969 | Kefalas et al. |
| 3,673,581 A * | 6/1972 | Nishida ................ H01F 10/06 365/139 |

(Continued)

OTHER PUBLICATIONS

Rejaei, et al., "Suppression of skin effect in metal/ferromagnet superlattice conductors", Journal of Applied Physics 96, 6863 (2004), doi: 10.1063/1.1812360.

(Continued)

*Primary Examiner* — Timothy Thompson
*Assistant Examiner* — Amol Patel
(74) *Attorney, Agent, or Firm* — Thomas Horstemeyer, LLP

(57) ABSTRACT

Various examples are provided for low ohmic loss radial superlattice conductors. In one example, among others, a conductor includes a plurality of radially distributed layers that include a non-permalloy core, a permalloy layer disposed on and encircling the non-permalloy core, and a non-permalloy layer disposed on and encircling the permalloy layer. The non-permalloy core and non-permalloy layer can include the same or different materials such as, e.g., aluminum, copper, silver, and gold. In some implementations, the non-permalloy core includes a void containing air or a non-conductive material such as, e.g., a polymer. The permalloy layer can include materials such as, e.g., NiFe, FeCo, NiFeCo, or NiFeMo. In another example, a via connector includes the plurality of radially distributed layers including the permalloy layer and the non-permalloy layer disposed on and encircling the permalloy layer. The via (Continued)

connector can extend through glass, silicon, organic, or other types of substrates.

20 Claims, 14 Drawing Sheets

(51) Int. Cl.
    *H01B 11/18*     (2006.01)
    *H01L 23/498*     (2006.01)
    *H01L 23/66*     (2006.01)

(52) U.S. Cl.
    CPC .. *H01L 23/49827* (2013.01); *H01L 23/49866* (2013.01); *H01L 23/49894* (2013.01); *H01L 23/66* (2013.01); *H01L 2223/6622* (2013.01); *H01L 2223/6627* (2013.01); *H01L 2924/0002* (2013.01)

(56) References Cited

U.S. PATENT DOCUMENTS

| | | | | |
|---|---|---|---|---|
| 3,715,793 | A * | 2/1973 | Kefalas | G11B 5/004 365/173 |
| 2008/0030906 | A1 * | 2/2008 | Sato | B82Y 10/00 360/324.2 |
| 2009/0126983 | A1 * | 5/2009 | Harvey | H05K 3/4602 174/266 |
| 2011/0128111 | A1 | 6/2011 | Roozeboom et al. | |

OTHER PUBLICATIONS

Iramnaaz, et al., "High Quality Factor RF Inductors Using Low Loss Conductor Featured with Skin Effect Suppression for Standard CMOS/BiCMOS", IEEE, 2011 Electronic Components and Technology Cionference, pp. 163-168.

Yamaguchi, et al., "Skin Effect Suppression in Multilayer Thin-Film Spiral Inductor Taking Advantage of Negative Permeability of Magnetic Film beyond FMR frequency", EuMA, Sep. 28-30, 2010, Paris, France, Proceedings of the 40th European Microwave Conference, pp. 1182-1185.

Youssef, et al., "Thickness-dependent magnetic excitations in Permalloy films with nonuniform magnetization", The American Physical Society, Physical Review B, 2004, pp. 69, 174402-174402-9.

International Search Report for PCT/US2014/046299 mailed on Nov. 14, 2014.

Wu, et al., "A Low Ohmic Loss Radial superlattice Conductor at 15 GHz using Eddy Current Canceling Effect", Department of Electrical and Computer Engineering, University of Florida, Jul. 2013.

* cited by examiner

| Compound (g/L) | Concentration |
|---|---|
| Nickel Sulfate | 200 |
| Iron Sulfate | 8 |
| Nickel Chloride | 5 |
| Boric Acid | 25 |
| Saccharin | 3 |
| pH | 4 |
| Temperature | 24° C |
FIG. 16
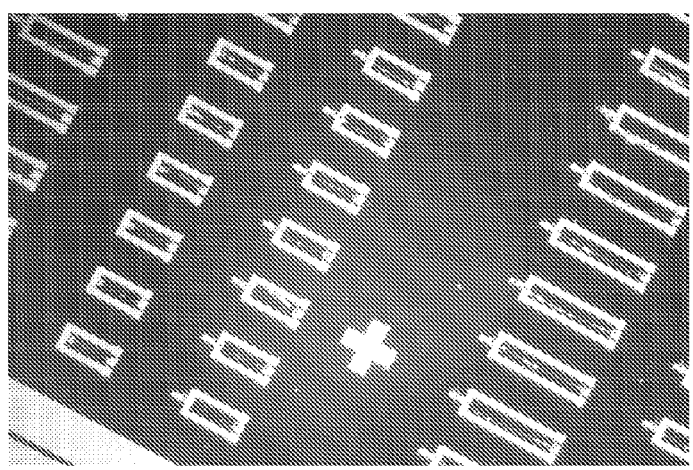
FIG. 17A
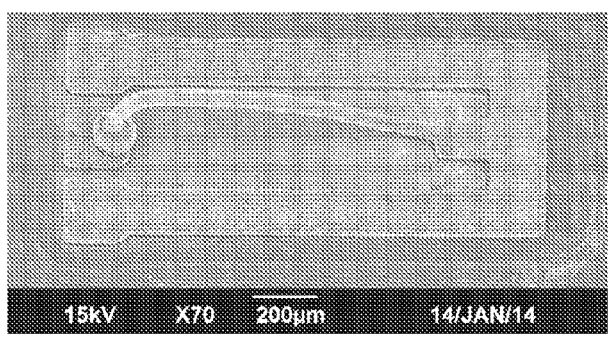
FIG. 17B
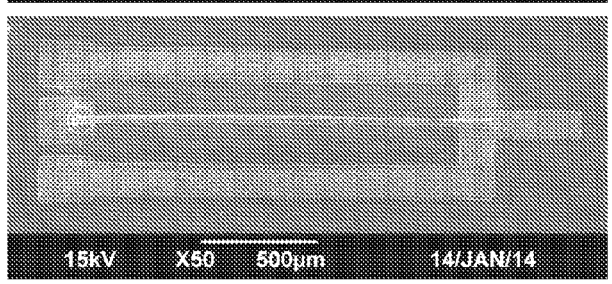
FIG. 17C

LOW OHMIC LOSS RADIAL SUPERLATTICE CONDUCTORS

CROSS REFERENCE TO RELATED APPLICATIONS

This application is the 35 U.S.C. §371 national stage application of PCT Application No. PCT/US2014/046299, filed Jul. 11, 2014, which claims priority to and the benefit of U.S. provisional application entitled "LOW OHMIC LOSS RADIAL SUPERLATTICE CONDUCTOR" having Ser. No. 61/845,488, filed Jul. 12, 2013, the entirety of both are hereby incorporated by reference.

STATEMENT REGARDING FEDERALLY SPONSORED RESEARCH OR DEVELOPMENT

This invention was made with government support under agreement ECCS 1132413 awarded by the National Science Foundation. The Government has certain rights in the invention.

BACKGROUND

The conduction loss in the radio frequency (RF) and microwave frequency ranges is greatly influenced by the conductivity of the materials, the proximity effect, and the skin effect. The proximity effect and skin effect introduce high RF losses can result from magnetic fields generated by nearby conductors and from a magnetic field generated by the conductor itself, respectively.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 16 is a table showing the utilized NiFe electroplating solution bath for formation of a CRS conductor in accordance with various embodiments of the present disclosure.

FIGS. 17A-17C are images of fabricated CRS conductors of FIG. 14 in accordance with various embodiments of the present disclosure.

DETAILED DESCRIPTION

Figure 1A:
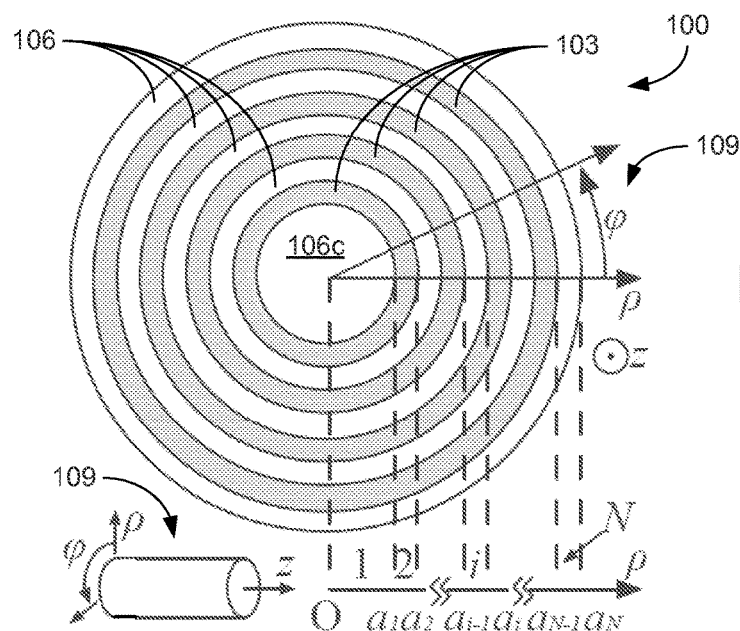
FIGS. 1A and 1B are graphical representations illustrating an example of a cylindrical radial superlattice (CRS) structure for a conductor in accordance with various embodiments of the present disclosure.

Disclosed herein are various examples related to embodiments of superlattice conductors. In this disclosure, examples of planar superlattice and cylindrical radial superlattice (CRS) conductors for improved radio frequency (RF) resistance suppression at a targeted RF frequency are discussed. Reference will now be made in detail to the description of the embodiments as illustrated in the drawings, wherein like reference numbers indicate like parts throughout the several views.

The operational frequency of monolithic integrated circuits has reached the gigahertz (GHz) range in modern communication and consumer electronic applications. The clock frequency of today's microprocessors has reached 3 GHz and is moving to higher frequencies. One of the limiting factors of the high frequency operation is the radio frequency (RF) loss including the dielectric and conductor loss which are associated with the devices and circuits operating in the RF range. The dielectric loss could be reduced by locally removing the dielectric materials forming air-lifted architectures or using very low loss dielectric materials. Meantime, most electrodes or interconnectors utilize copper as the conducting material because of its low electrical resistivity, ease of deposition and moderate cost.

Copper is widely used as a low loss conductor in standard microfabrication processes of the integrated circuit (IC) and micro electromechanical systems (MEMS) industries mainly due to its high conductivity, ease of deposition and relatively low cost. However, at higher frequencies, its high conductivity is not as effective and beneficial as it is at low frequency and DC operation because of the skin effect, where most current is confined in the outermost surface of the conductor thus reducing the effective cross-section of the conductor and increasing the ohmic resistance. As a result, the effective cross section is reduced in RF frequencies and the resistance and conductor loss are increased. Therefore, the conductor loss together with the dielectric loss will increase the total loss of the systems operating at these higher frequencies.

These losses together with the inherent parasitic capacitance in those circuits result in the so called RC (resistance-capacitance) time delay, which can prevent the operating frequencies from going higher. The high frequency interconnects, transmission lines and vias in a standard CMOS process and in through silicon/glass via (TSV/TGV) structures can suffer from large conductor loss. In various embodiments, a via can pass through a silicon substrate, a glass substrate, an organic substrate, or other types of substrates as can be understood. The larger conductor loss will also be significant in high speed digital circuits including analog-to-digital/digital-to-analog converters and processors which will lead to a substantially large RC delay and limit the maximum operation frequency.

Superlattice structures can be used to reduce the conductor loss by forcing the current to flow inside the volume of the conductor instead of its edges. Reduction of the conduction loss from proximity and skin effects in conductors can improve performance of RF transmissions. The proximity effect can be partially alleviated by macroscopic patterning of the conductors and different constructions (e.g., a litz wire) while the skin effect demands more microscopic treatment.

In a planar superlattice structure, the multiple layers of ferromagnetic/non-ferromagnetic metals can be used as the conductor where the negative permeability of the ferromagnetic material has the effect of cancelling out the eddy currents inside the conductor and allowing the current to flow inside the volume to reduce the conductor loss. For example, a practical application of the planar superlattice structure includes RF inductors using a planar multilayered superlattice structure that is fabricated to provide skin effect suppression and increased quality factors. Multilayer interconnects can also improve the loss and quality factor of a coplanar waveguide (CPW) transmission line.

A planar superlattice structure of alternating ferromagnetic/non-ferromagnetic thin films deposited vertically on each other in stack layers suppresses the skin effect and lowers the conductor loss. Because of the negative permeability of the ferromagnetic metal layers in frequencies above the magnetic resonance ($f_{MR}$), it is possible to make the effective permeability of the multilayer stack including the negative/positive permeability of the ferromagnetic/non-ferromagnetic metals close to zero and increase the skin depth. In this way, the current can be forced to flow through the volume of the conductor where the effective area is increased leading to a considerably lower conductor loss. Although the planar superlattice conductors can decrease the ohmic loss of the conductors in the high frequency region, the electromagnetic discontinuity at the edge of the conductor may exhibit large fringing effects, which may limit the eddy current suppression of the planar superlattice conductors in practice.

Skin effect suppression using the cylindrical radial superlattice (CRS) architecture, where the round shape conductors benefit from continuity and no edge fringing effect in the azimuthal direction, can be used in a microwave coaxial cable setup. Low conductor loss cylindrical via architectures using the CRS architecture including alternating nanoscopic ferromagnetic/non-ferromagnetic conductors, and the design procedure, will be disclosed for the high frequency TSV/TGV and CMOS via usage. Theoretical and numerical analyses of the CRS structure with circular and conformal boundary conditions demonstrate the suppression of skin effects and RF conductor loss. Operation of CRS conductors including alternating magnetic/nonmagnetic nanolayers working in the microwave range is demonstrated and an implementation of a high Q-factor microwave inductor made of the CRS conductor exhibited a Q-factor of 45 at 18 GHz, which may be attributed to the low conductor and dielectric losses.

Superlattice structures comprising ferromagnetic/non-ferromagnetic metals can be used to create high performance conductors for radio frequency (RF) structures (e.g., RF transmission lines and low loss vias in CMOS and through silicon/glass via (TSV/TGV) structures) whose ohmic resistance and resistance-capacitance (RC) delays have been reduced. Two permalloys of $Ni_{80}Fe_{20}$ and FeCo are studied as the ferromagnetic materials with low and high magnetization saturation that can be used for designing superlattice structures with low and high GHz frequency ranges, respectively. The effects of design parameters including the number of layers and thickness ratio of the superlattice structures have been studied. Full wave simulations have been used to verify them. Finally, a radial superlattice structure consisting of NiFe/Cu layers has been implemented and its resistance has been compared with the control solid-core devices made of solid copper; proving the effectiveness of the proposed radial superlattice structure for reducing the RF loss.

The skin effect can be characterized in homogeneous structures by the skin depth (δ) as described by:

$$\delta = \sqrt{\frac{2}{\omega \mu_0 \mu_r \sigma}}, \quad (1)$$

where $\omega = 2\pi f$ is the angular frequency, $\mu_0$ is the free space permeability, $\mu_r$ and $\sigma$ are relative permeability and conductivity of the conductor, respectively. Skin effect suppression and its applications may be all based on a planar superlattice architecture, where the conductor has a finite conductor width and thickness. Because of the finite conductor dimensions and the boundary conditions, the accuracy of the analytical solution may be hampered. As a result, although certain resistance suppression can be achieved, the tunability and performance may be further improved.

From Equation 1, by setting the $\mu_r$ inside the conductor to a value very close to zero, it is possible to enlarge the skin depth. By assuming that the conductor carrying the high frequency signal comprises multiple non-ferromagnetic and ferromagnetic layers, the effective permeability of the stack layers is, $$\mu_{eff} = \frac{\mu_N t_N + \mu_F t_F}{t_N + t_F}, \quad (2)$$

where $\mu_N$ and $\mu_F$ are the permeability of the non-ferromagnetic and ferromagnetic metals, and $t_N$ and $t_F$ are their thicknesses, respectively. The permeability of a thin film ferromagnetic material is given by:

$$\mu = \mu' + j\mu'', \quad (3)$$

where $\mu'$ is the real part and $\mu''$ is the imaginary part of the permeability. The Landau-Lifshitz-Gilbert (LLG) equation can be used to estimate the dynamic response of the ferromagnetic thin film from which the complex permeability of the thin film can be given by:

$$\mu = \left\{ 1 + \gamma^2 4\pi M_s + \frac{[H_{Kp} - H_{Ku} + 4\pi M_s + j\omega\alpha/\gamma]}{\gamma^2 H_{Kp}[H_{Kp} - H_{Ku} + 4\pi M_s] - \omega^2 + j\omega\alpha\gamma[2H_{Kp} - H_{Ku} + 4\pi M_s]} \right\} \times \quad (4)$$

$$\frac{\tanh[(1+j)t/(2\delta)]}{(1+j)t/(2\delta)}$$

where $M_s$ is the magnetic saturation of the thin film, $H_{Kp}$ is the in-plane anisotropy field, $H_{Ku}$ is the out-of-plane anisotropic field, $\gamma$ is the gyromagnetic ratio, $\alpha$ is the Gilbert damping parameter, and t is the thickness of the thin film. The skin depth, $\delta$, is calculated by using the electrical conductivity ($\sigma$).

Figure 1B:
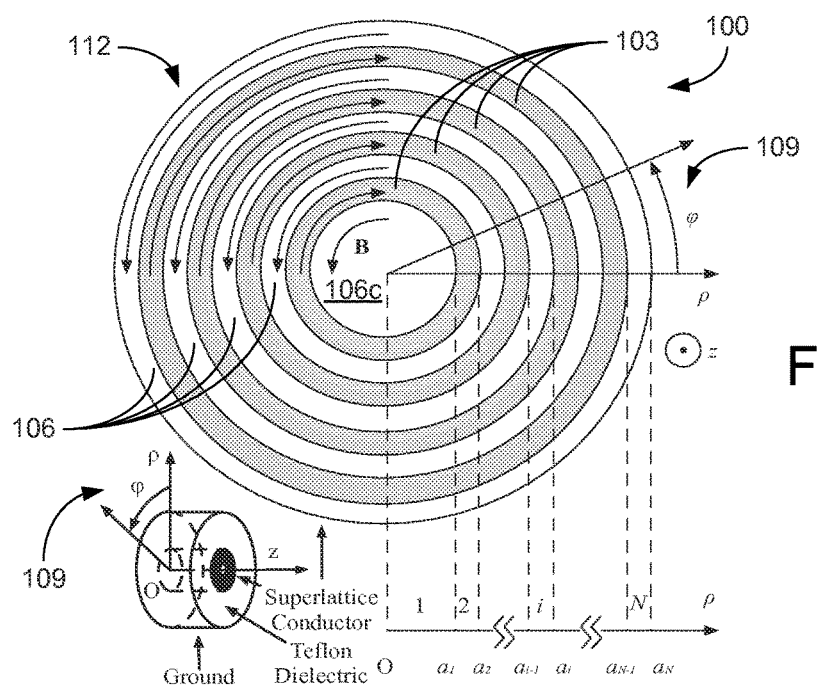

Referring to FIGS. 1A and 1B, shown is an example of a CRS structure 100 composed of alternating concentric layers of permalloy 103 and non-permalloy material 106 such as, e.g., aluminum (Al) for a low loss radio frequency (RF) conductor. Permalloy includes, e.g., NiFe, FeCo, NiFeCo, NiFeMo, etc. Non-permalloy materials include, e.g., aluminum, copper, silver, gold, etc. The CRS structure 100 utilizes an eddy current canceling effect produced by the alternating permalloy layers 103 and non-permalloy layers 106 at the targeted frequency. Theoretical and numerical analyses are presented in the cylindrical coordinate system. Compared with a conventional planar superlattice, the CRS offers a circular and conformal boundary condition, resulting in better analytical and numerical solutions for the suppression of RF conductor loss. For example, with the CRS structure 100 of FIGS. 1A and 1B, RF resistance may be reduced by up to 50% at 15 GHz when compared to a solid conductor.

The concentric superlattice is implemented, using N alternating layers of permalloy 103 and non-permalloy materials 106, to produce a cylindrical structure with a total radius of $a_N$. As shown in FIGS. 1A and 1B, a non-permalloy core 106c forms the first layer with a radius of $a_1$. The CRS structure 100 contains only one the boundary condition between each layer 103 and 106. The CRS structure 100 will be further discussed using a cylindrical coordinate system ($\rho$, $\phi$, z) 109. In the example of FIGS. 1A and 1B, the permalloy layers 103 and non-permalloy layers 106 (e.g., Al or other appropriate conductive material) are designed to produce negative-permeability and positive permeability, respectively, at the frequency of interest, canceling the eddy currents generated by the alternating layers and suppressing RF conductor loss.

The non-permalloy core 106c may be the same non-permalloy material as the other non-permalloy layers 106 or may be a different non-permalloy material. For example, the non-permalloy core 106c may be a non-conducting material or electrical insulator such as, e.g., a polymer. In some implementations, the non-permalloy core 106c may be a void containing, e.g., air or other inert gas. In other embodiments, the non-permalloy core 106c may include a non-permalloy material with an axial void. An insulation layer (not shown) can be disposed around the CRS structure 100 (e.g., encircling an outermost non-permalloy layer 106 of FIGS. 1A and 1B) for electrical isolation and protection.

Due to the fact that the skin depth is getting smaller as the frequency increases, the ohmic loss unavoidably keeps rising in a regular conductor. FIG. 1B shows a schematic diagram illustrating a cross-section view of a conductor with a CRS structure 100 that is used to suppress the ohmic loss. The example of FIG. 1B shows the CRS conductor with a ferromagnetic as the permalloy layers 103 (grey regions) and a metal thin film as the non-permalloy layers 106 (white regions) with N layers and a total radius $\rho = a_N$ in the cylindrical coordinate system. Although the permeability of the non-ferromagnetic layers is constant and does not vary with respect to frequency ($\mu_N=1$ at all frequencies), the permeability of the ferromagnetic metal layers is a function of the frequency and is negative between the ferromagnetic resonance frequency ($f_{MR}$) and the anti-resonance frequency ($f_{AR}$). The arrows 112 show the direction of the induced eddy currents, which are opposing each other in the design frequency region due to the negative permeability of the ferromagnetic thin film layers 103.

When operating between $f_{MR}$ and $f_{AR}$, the real part of the permeability ($\mu'$) is negative. Therefore, the ratio of the thickness of the non-ferromagnetic metal layer (e.g., copper or aluminum) and the ferromagnetic metal layer $t_N/t_F$ is an important design parameter which determines the operation frequency. By properly choosing the thickness ratio based on EQN (2), it is possible to make the effective magnetic permeability close to zero and enlarge the skin depth, resulting in the reduction of the conduction loss in the frequency range of interest.

Design Theory

Figure 2A:
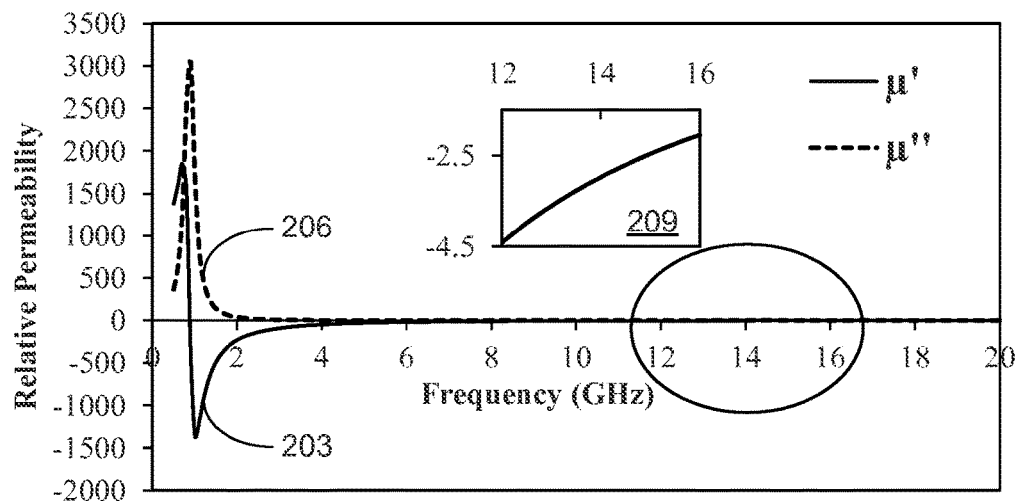
FIGS. 2A and 2B are plots illustrating examples of the relative complex permeability of permalloy spectra in accordance with various embodiments of the present disclosure.

The dynamic response of permalloy thin films has been investigated theoretically and experimentally. Permalloy (e.g., $Ni_{80}Fe_{20}$) films are one of the most commonly studied soft magnetic materials, whose complex permeability spectra can be characterized by the Landau-Lifshitz-Gilbert equation. The complex permeability can be expressed by EQN (3) with $\mu'$ as the real part and $\mu''$ as the imaginary part. Referring to FIG. 2A, shown is a plot illustrating an example of the relative complex permeability of the permalloy spectra, where $\mu'$ (curve 203) is the real part and $\mu''$ (curve 206) is the imaginary part. The calculated permeability of the permalloy assumes no external magnetic field. The inset portion 209 shows the real part $\mu'$ for the frequencies between 12 GHz and 16 GHz.

Figure 2B:
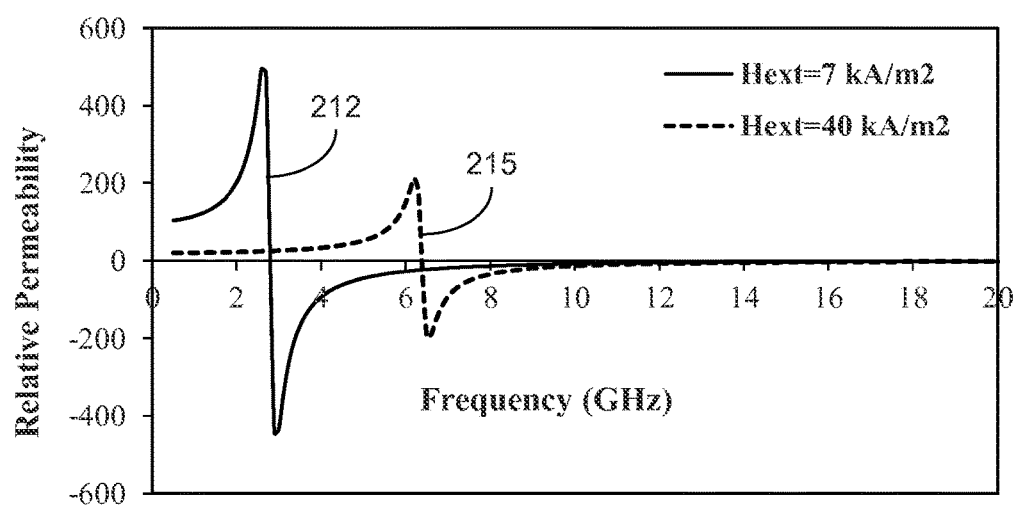

The example of FIG. 2A shows the calculated permeability of the $Ni_{80}Fe_{20}$ using the LLG equation where the magnetic saturation $M_s=10,000$ G=1 T for permalloy, the in-plane anisotropy field $H_{Kp}=10$ Oe, the out-of-plane anisotropic field $H_{Ku}=10$ Oe, the gyromagnetic ratio $\gamma=1.75 \times 10^7$ $s^{-1}$ $Oe^{-1}$, the Gilbert damping parameter $\alpha=0.01$, and t is the typical thickness of the thin film. The skin depth, $\delta$, is calculated by using the electrical conductivity of permalloy and copper where or $\sigma_{permalloy}=6 \times 10^6$ S/m and $\sigma_{Cu}=5.8 \times 10^7$ S/m, respectively. The resonance frequency of permalloy thin film, $f_{MR} \approx 900$ MHz and the anti-resonance frequency is $f_{AR} \approx 28$ GHz. FIG. 2B shows the tunability of the permeability of the ferromagnetic materials by using an external magnetic field ($H_{ext}$). The $f_{MR}$ frequency shifts to higher frequencies as $H_{ext}$ increases from 7 kA/m² (curve 212) to 40 kA/m² (curve 215). Therefore, the $\mu_F$ in EQN (2) also shifts, making it possible to design the conductor for multiple target frequencies. For example, a CRS conductor can be used to implement tunable inductors, transformers, metamaterials, resonators, filters, antennas, and/or interconnects.

Figure 3A:
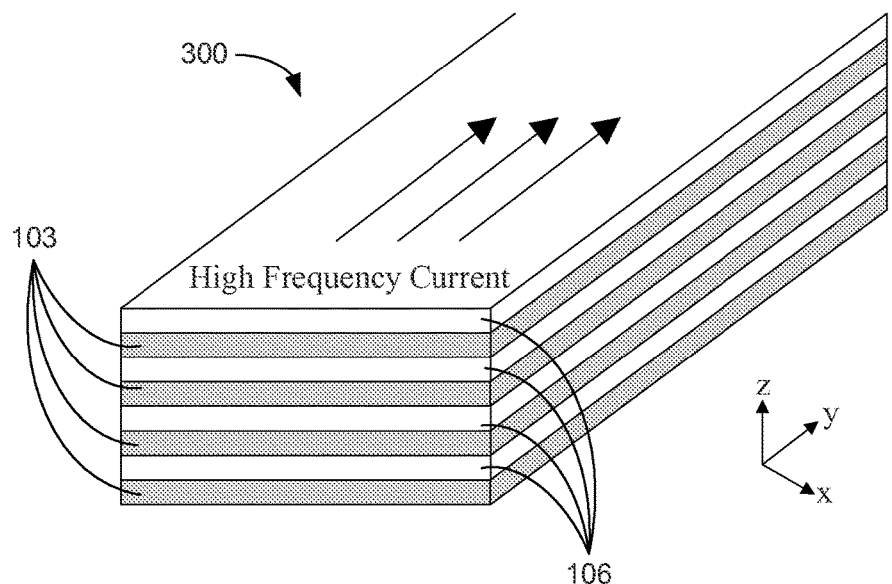
FIGS. 3A-3C are graphical representations illustrating an example of a planar superlattice structure for a conductor in accordance with various embodiments of the present disclosure.

Referring next to FIG. 3A, shown is a conductor using a planar superlattice structure 300 including layers of permalloy 103 and non-permalloy material 106, where the high frequency current is flowing in the longitudinal y-direction with a transverse magnetic field flowing along each layer in the x-direction. The negative permeability of the ferromagnetic layers 103 operating in the design frequency results in a longitudinal direction eddy current opposite to the one generated by metal layers 106 with positive permeability. By manipulating the forward and reverse eddy currents to the extent that they are evenly cancelled in each layer, the skin depth and the effective area will be enlarged, the alternating current flow will be more uniform, and the microwave resistance at the designed frequency range will be reduced. The planar superlattice conductor 300 can have an electromagnetic discontinuity at the edge of the conductor, which can result in large fringing effects, that may limit the eddy current suppression of the planar superlattice conductor in practice.

Figures 3B, 3C:
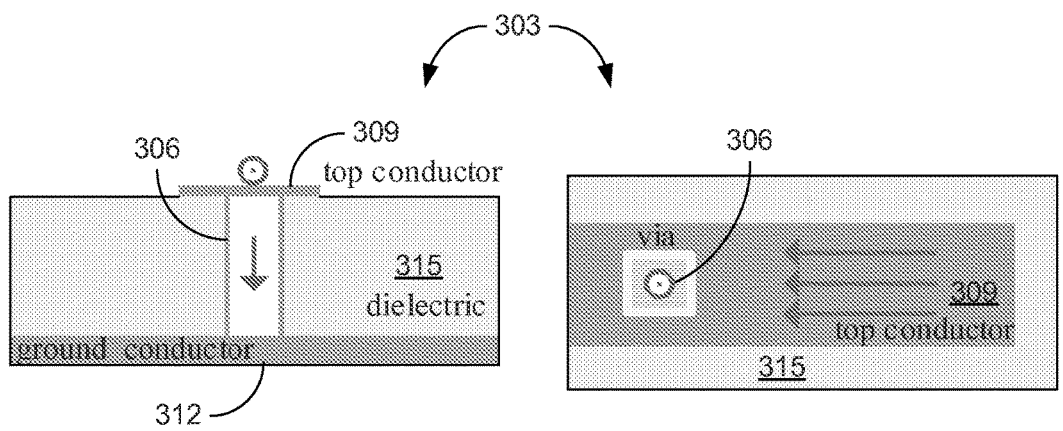

FIGS. 3B and 3C show a cross-sectional view and a top view, respectively, of a microstrip transmission line 303 with a via 306 connecting the top conductor 309 to the bottom ground plate 312 through a dielectric layer 315. Vias 306 are used in standard CMOS or TSV/TGV processes to vertically connect horizontal conductors. Therefore, to benefit from the eddy current cancelling structure in a via 306, stacked layers should be grown inside the via opening.

To overcome such drawbacks of the planar superlattice conductors, a CRS structure can be used that has a closed boundary condition in a radial direction and therefore is considered more appropriate for eddy current suppression and low conductor loss. A coaxial line using the CRS structure 100 will be evaluated. A radial superlattice via (RSV) structure will also be examined where the CRS structure has been employed to fabricate low loss vias to replace the vias that are known to produce high loss in a CMOS or TSV/TGV process. FIG. 1B depicts the cross section of the CRS conductor where the arrows show the generated eddy currents when an alternating current is flowing in z-direction.

Design Results

Figures 4A, 4B:
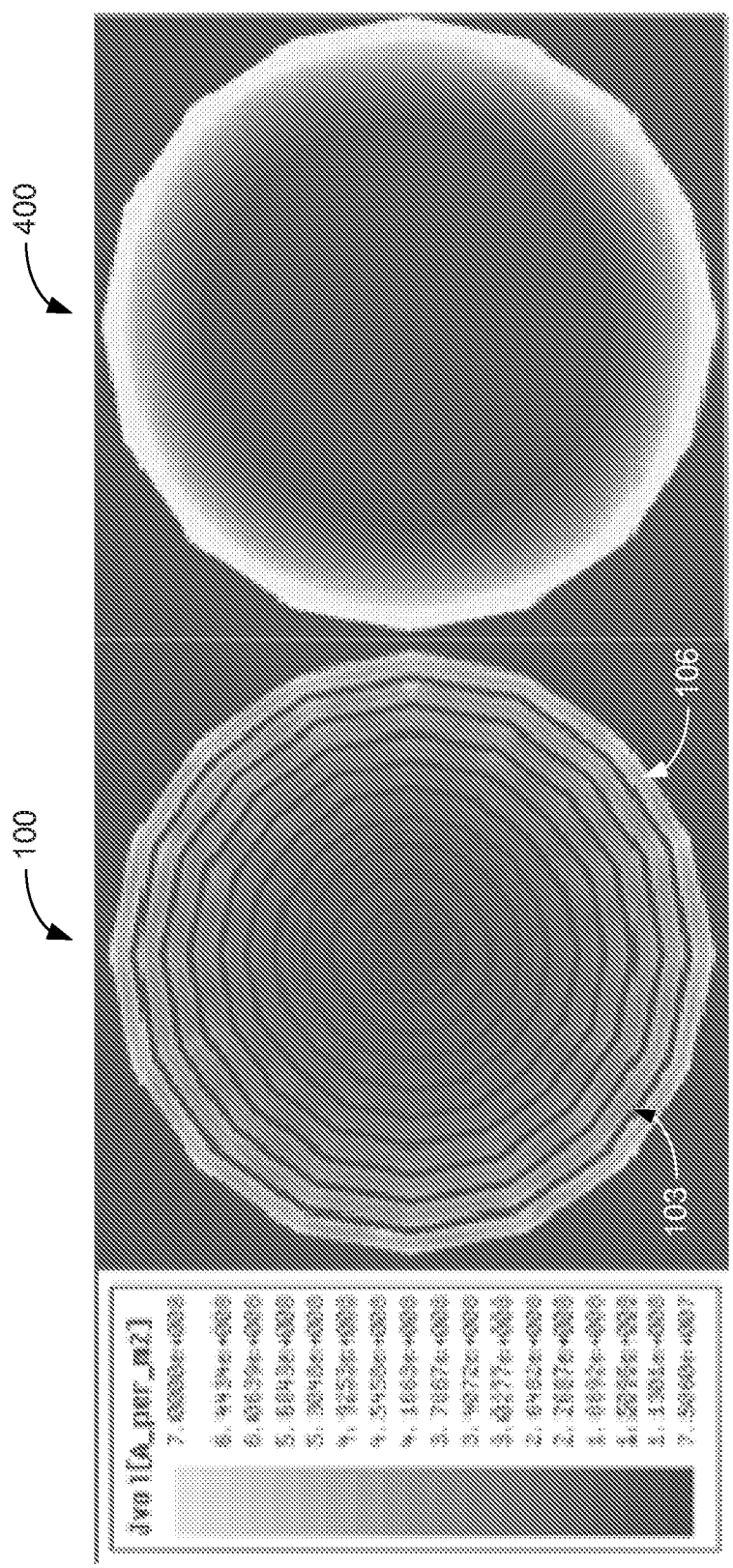
FIGS. 4A and 4B are graphical representations of an example of current density in a CRS conductor of FIGS. 1A and 1B and a solid conductor, respectively, in accordance with various embodiments of the present disclosure.

A coaxial line using the CRS structure 100 of FIGS. 1A and 1B was simulated to verify the design theory. Applications for a conductor using the CRS structure 100 include, but are not limited to, a coaxial cable, an inductor, a transformer, an antenna, a resonator, a metamaterial, and an interconnect such as, e.g., a thru-silicon-via (TSV), a thru-glass-via (TGV), or a thru-organic-via (TOV). Simulation was performed using a high frequency structure simulator (e.g., HFSS, Ansys Inc.) simulating a CRS structure 100 including alternating layers of permalloy and aluminum (Al). In order to match the impedance of the coaxial line to 50Ω in HFSS, the outer diameter was designed to be 20.1 μm, the inner diameter of the metallic line was 12 μm, and the total length of the conductor was 20 μm. FIG. 4A is a cross-sectional view of the simulated CRS structure 100a, which included 21 alternating layers with 10 permalloy layers 103 separating 11 Al layers 106. The layer thicknesses were determined for an operating frequency of 15 GHz. As can be understood, the CRS structure 100 can be determined other targeted frequencies of interest. The CRS structure 100 can be tuned to the targeted frequency by choosing appropriate permeable materials and geometries of the CRS structure 100.

FIG. 4A graphically illustrates an example of the current distribution (in A/m$^2$) in the simulated CRS structure 100a at 15 GHz. As can be seen in FIG. 4A, at least a portion of the current flows through each of the Al (or non-permalloy) layers 106. The current density of the outermost Al layer 106 is highest and the current densities of the inner Al layers 106 decrease towards the center of the CRS structure 100a. For comparison, FIG. 4B shows a cross-sectional view that graphically illustrates the current distribution (in A/m$^2$) in a solid Al conductor 400 under the same conditions. The skin effect concentrates the currents at the outer edge of the conductor 400 with little or no current flowing through the center portion of the conductor 400.

Figure 5:
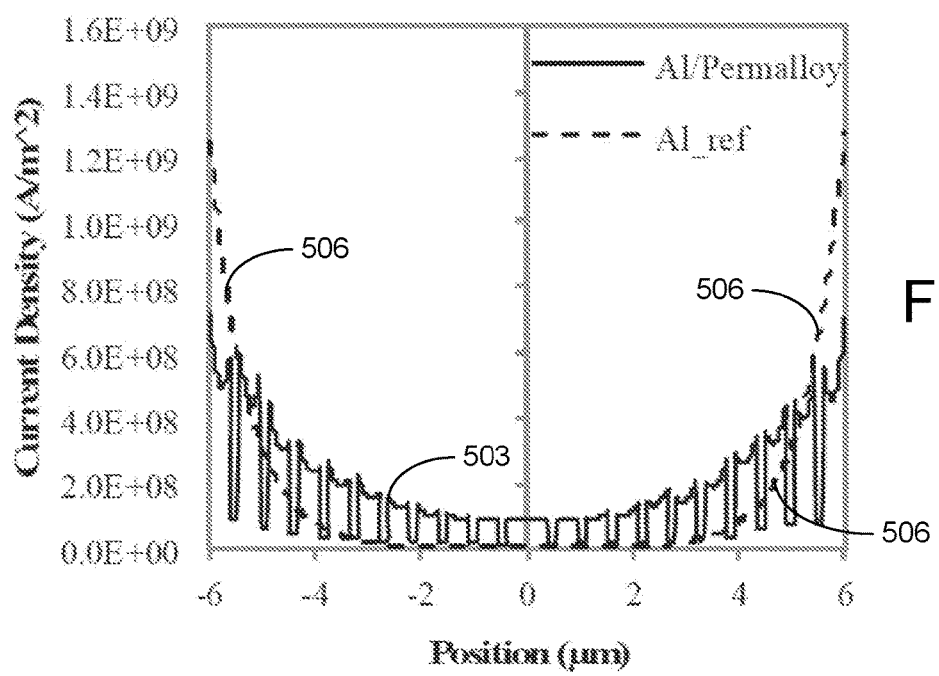
FIG. 5 is a plot illustrating examples of current densities in a CRS conductor of FIGS. 1A and 1B and a solid conductor in accordance with various embodiments of the present disclosure.

FIG. 5 is a plot showing an example of the current distributions of the simulated CRS structure 100a (solid curve 503) and the solid Al reference conductor 400 (dashed curve 506) at 15 GHz. As discussed, the current density in the solid Al conductor 400 is concentrated at the outer edge of the solid conductor 400, while the CRS structure 100a exhibits lower current densities at the outer edge of the conductor and higher current densities in the central portion of the conductor.

Figure 6:
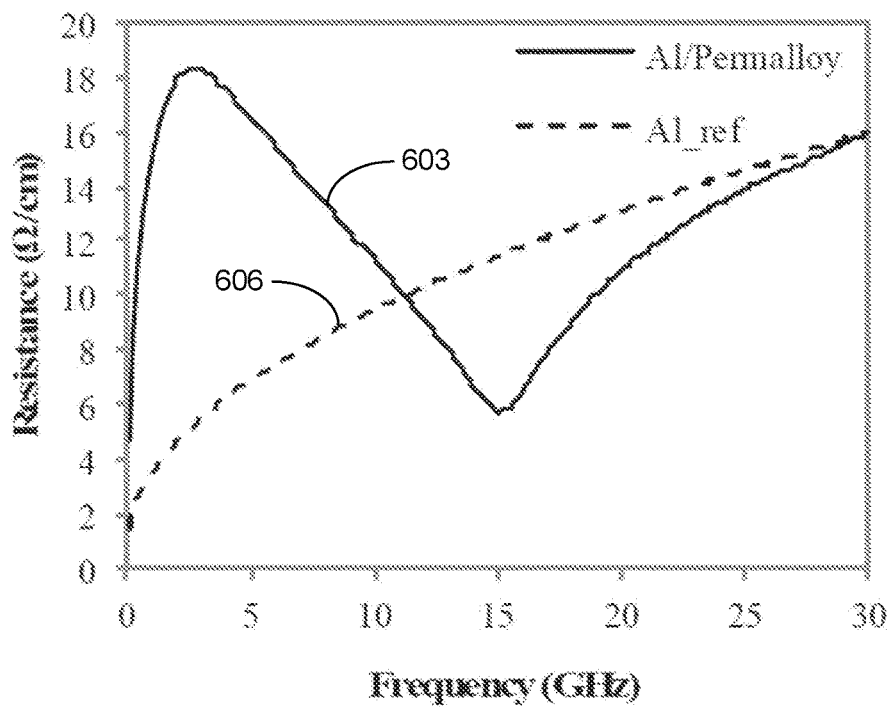
FIG. 6 is a plot illustrating examples of resistance spectra of a CRS conductor of FIGS. 1A and 1B and a solid conductor in accordance with various embodiments of the present disclosure.

Using a lumped element circuit model, the conduction resistance of the coaxial conductor with the CRS structure 100a can be extracted. The simulation results revealed that the resistance of a coaxial conductor having the simulated CRS structure 100a can be at least 50% lower than that of the solid Al conductor 400 at 15 GHz. The effective bandwidth of the ohmic loss reduction is between 12 GHz and 30 GHz as shown in FIG. 6. Examples of the resistance spectra for the coaxial conductor (solid line 603) and the solid Al reference conductor 400 (dashed curve 606) were plotted.

A cylindrical radial superlattice (CRS) conductor including alternating permalloy and Al layers has been demonstrated with a conduction resistance reduction of 50% at 15 GHz. By manipulating the magnetic field in each layer of the superlattce, eddy currents from the non-permalloy (e.g., Al) and permalloy layers cancel each other and result in a more uniform current distribution of the current through the cross-section of the CRS conductor. The eddy current canceling effect lowers the RF resistance of the CRS conductor, and the resistance spectra can be controlled by configuring the specific thickness of each layer based on the dynamic permeability of the superlattice film. The design theory and simulation results have been presented.

Figure 7:
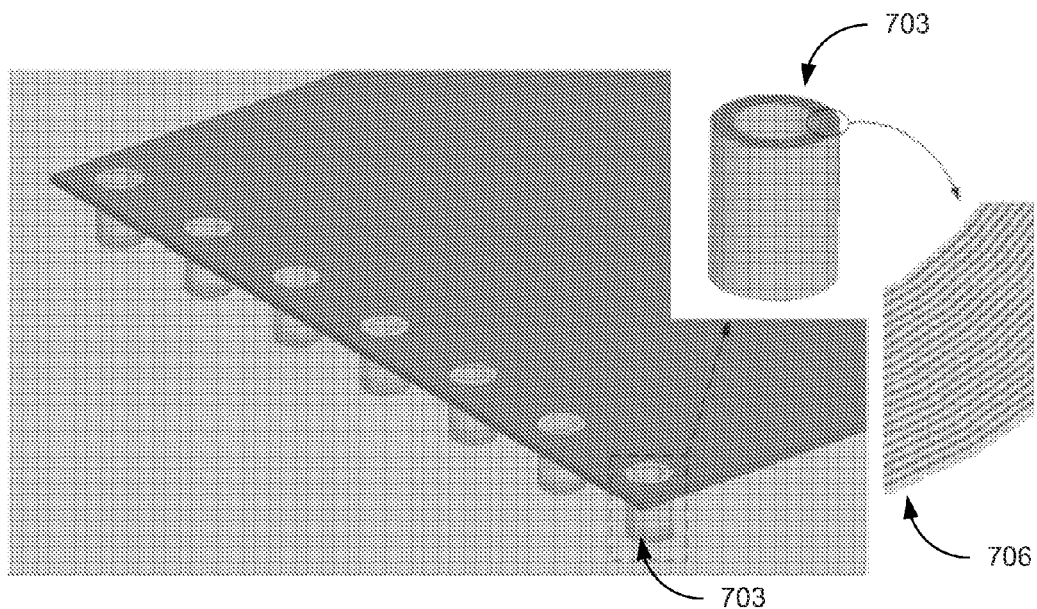
FIG. 7 is a graphical representation of radial superlattice vias (RSVs) constructed using the CRS structure of FIGS. 1A and 1B and a solid conductor in accordance with various embodiments of the present disclosure.

FIG. 7 shows an example of typical through silicon vias/through glass vias (TSV/TGV) 703 where the radial superlattice vias (RSV) structure, shown in cross-sectional view 706, has been employed to reduce the ohmic loss of the vias 703. The RSV can be constructed using the CRS structure in a typical RF MEMS process. An analysis of superlattice vias is followed by full-wave simulations using a high frequency structure simulator (HFSS, ANSYS Inc.) that validate the effectiveness of the CRS structure for conductor loss reduction in vias. The RVS structure can include a plurality of layers surrounding a hollow core or void, as illustrated in FIG. 7, or can include a solid core as illustrated in FIGS. 1A and 1B.

Figure 8:
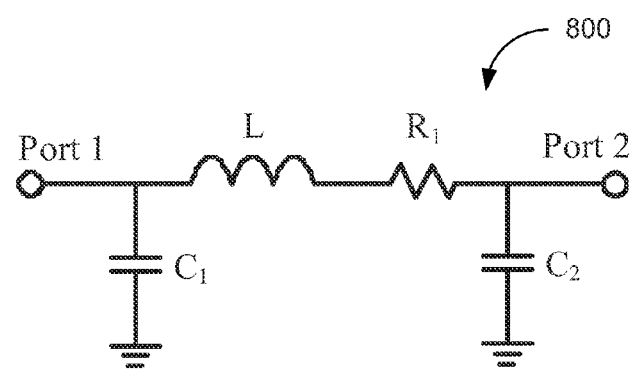
FIG. 8 is an example of a lumped element circuit model of a CRS conductor of FIGS. 1A and 1B and a solid conductor in accordance with various embodiments of the present disclosure.

The CRS conductor comprises a solid core conductor covered by laminated superlattice structures (FIG. 1B) where a ground plane was used underneath the structure, forming a coaxial structure, to allow propagation of transverse electromagnetic (TEM) waves. The lumped element equivalent circuit model 800, as shown in FIG. 8, will be used to extract the conduction resistance of the conductor. By analyzing the Y-parameters, the values of the equivalent circuit elements can be expressed as, $$\text{Re}[Y21] = \frac{-R_1}{R_1^2 + \omega^2 L_1^2}, \tag{5a}$$

$$\text{Im}[Y21] = \frac{\omega L_1}{R_1^2 + \omega^2 L_1^2}, \tag{5b}$$

where the resistance and inductance can be found by solving EQNS (5a) and (5b) to give:

$$L_1 = \frac{\text{Im}[Y21]}{\omega[(\text{Re}[Y21])^2 + (\text{Im}(Y21))^2]}, \quad (6a)$$

$$R_1 = \frac{(-\text{Re}[Y21])^{-1} \pm \sqrt{(\text{Re}[Y21])^{-2} - 4\omega^2 L_1^2}}{2}. \quad (6b)$$

Figure 9:
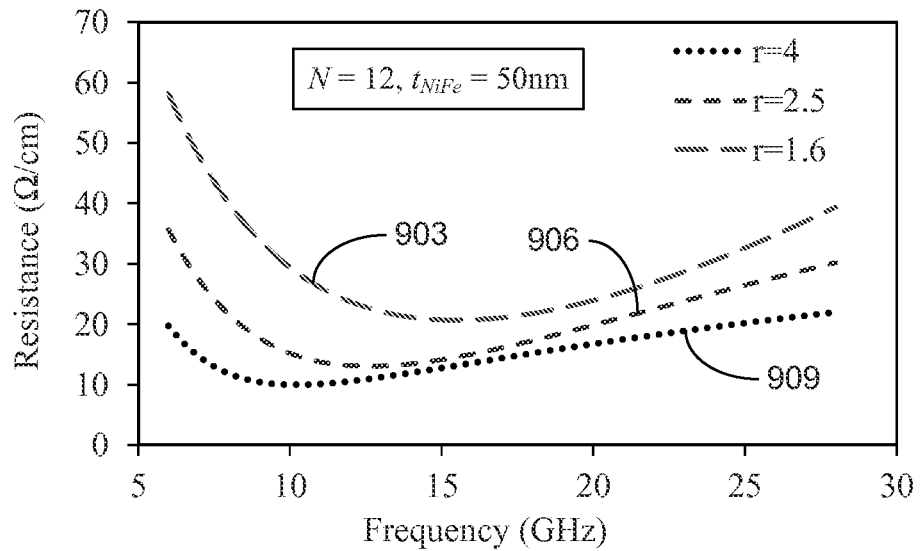
FIGS. 9-13 are graphical representations of examples of simulation results for the CRS structure of FIGS. 1A and 1B in accordance with various embodiments of the present disclosure.

As previously discussed, copper is widely used as the conductor in standard manufacturing processes that has high conductivity and can be deposited using standard microfabrication processes. Referring to FIG. 9, shown are the simulation results of the RSV structure where NiFe/Cu are used as the magnetic/non-magnetic metal layers. The relatively low magnetization saturation of the NiFe allows the RSV to operate in the lower frequency region (up to minimum 5 GHz). The extracted resistance of the radial superlattice conductor using EQNS (6a) and (6b) has been compared to that of a solid conductor with the same thickness, but including no laminated structure. The simulation results of three NiFe/Cu RSV structures with N=12 layers and a NiFe layer thickness of $t_{NiFe}$=50 nm were plotted.

In the example of FIG. 9, the resistance of the NiFe/Cu conductor was simulated where the effect of different thickness ratios of the non-ferromagnetic copper layer and the ferromagnetic NiFe layer ($r=t_N/t_F=t_{Cu}/t_{NiFe}$) was evaluated to show the capability of tuning the operational frequency (frequency where the resistance spectra is minimum) while maintaining the number of layers (N) and the thickness of the NiFe ($t_{NiFe}$) constant. Curve 903 corresponds to r=1.6 and $t_{Cu}$=80 nm, curve 906 corresponds to r=2.5 and $t_{Cu}$=125 nm, and curve 909 corresponds to r=4.0 and $t_{Cu}$=200 nm. The frequency at which the effective permeability is closest to zero indicates the minimum ohmic resistance, which can be tuned based on the given thickness ratio r. By increasing the thickness ratio, the minimum frequency shifts to lower frequencies. The conductor with r=4.0 (curve 909) has the lowest minimum resistance because the overall conductor thickness is larger than those of other conductors with r=2.5 and r=1.6.

Figure 10:
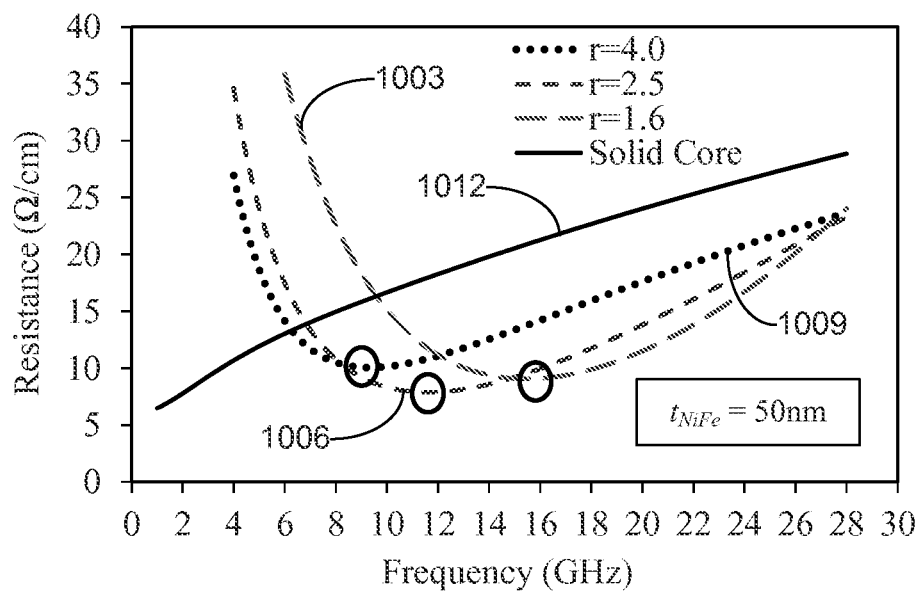

In FIG. 10, the same three ratios of the superlattice structure $r=t_{Cu}/t_{NiFe}$ were investigated with a constant $t_{NiFe}$=50 nm and a constant total conductor thickness (diameter). The overall diameter of the RSV structures and the solid conductor was kept the same (7 μm thick) in order to examine the effect on the conductor resistance. Curve 1003 corresponds to r=1.6, curve 1006 corresponds to r=2.5, and curve 1009 corresponds to r=4.0. Curve 1012 corresponds to a solid copper core conductor, for comparison. It can be seen in FIG. 10 that, while the indicated minimum values of the resistances are close to each other due to the same total conductor thickness for different Cu/NiFe thickness ratios, the conductor with the highest r (curve 1009) has the lowest minimum resistance. By properly selecting the thickness ratio of the conductors, it is possible to place the minimum resistance area in the frequency of operation range. In FIG. 10, minimum point frequencies of 9, 12 and 16 GHz were obtained by using the $r=t_{Cu}/t_{NiFe}$ ratio of 4.0, 2.5, and 1.6, respectively. At the lower frequency range (below 5 GHz), the resistance of the superlattice structure remains high because of the high permeability of the ferromagnetic layers makes the skin depth very thin (as based on EQN (1)) and increases the ohmic loss.

Figure 11A:
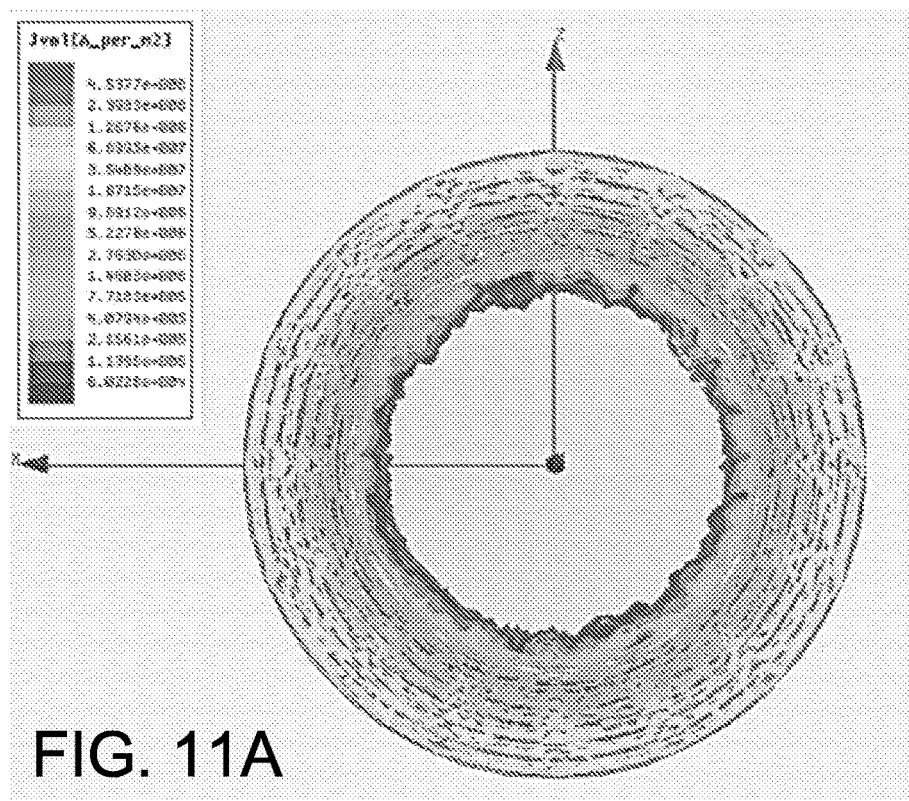
Figure 11B:
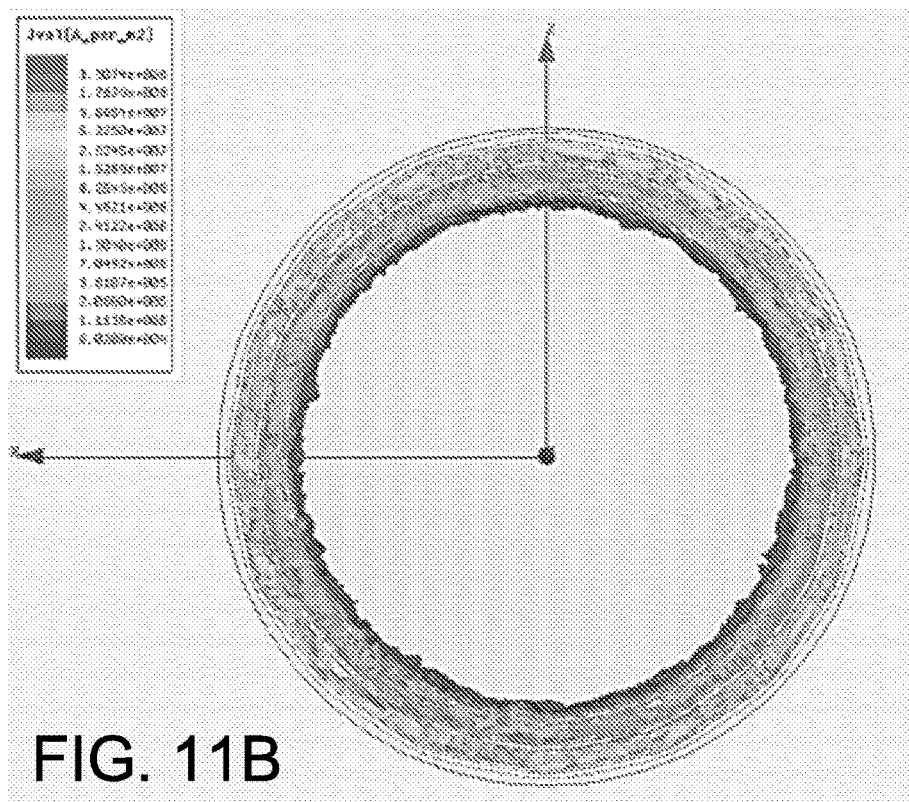

The eddy current canceling effect begins in the frequency range where the effective permeability approaches zero, and so the resistance does not go up with increasing frequency. After the operational frequency range, the resistance starts increasing normally with an order of $\sqrt{f}$. FIGS. 11A and 11B illustrate examples of the current distribution throughout a CRS conductor and a solid copper conductor based upon simulation results. FIG. 11A shows the current distribution throughout the volume of a CRS conductor with 21 layers, where the resistance has been minimized at a design frequency of 16 GHz. In comparison, FIG. 11B shows the current distribution throughout a solid core conductor where the current is confined in the outermost region of the conductor due to the skin effect. The same minimum and maximum current boundaries were set for both graphs.

Figure 12:
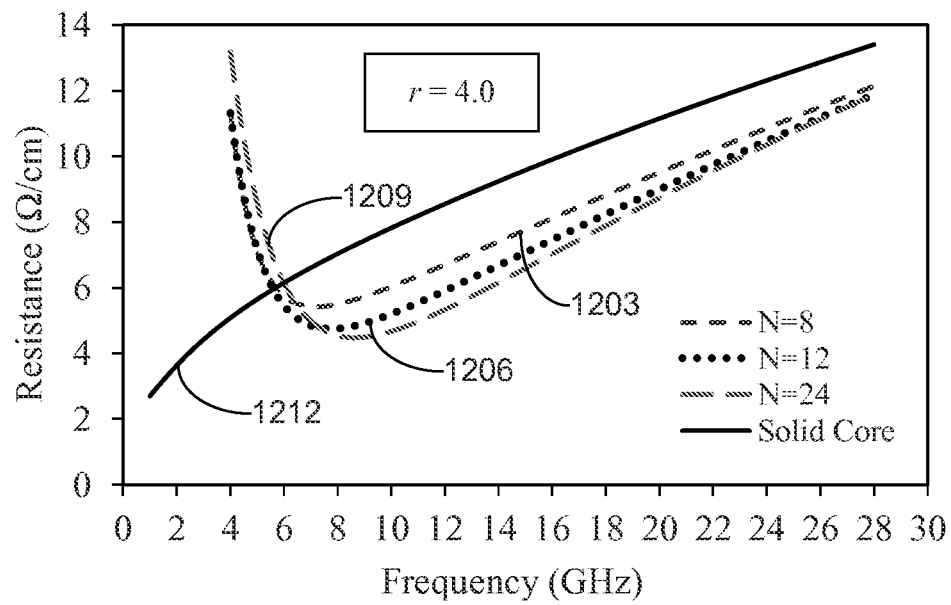

Referring next to FIG. 12, another set of simulations was performed using a 13 μm thick RSV where the thickness ratio ($r=t_{Cu}/t_{NiFe}$=4.0) was kept constant while the number of layers were changed to study the effect of the number of layers on the resistance spectra. The extracted resistance of the control solid-core Cu conductor has also been showed in FIG. 12 for the sake of comparison. Curve 1203 corresponds to N=8 ($t_{NiFe}$=150 nm, $t_{Cu}$=600 nm), curve 1206 corresponds to N=12 ($t_{NiFe}$=100 nm, $t_{Cu}$=400 nm), curve 1209 corresponds to N=24 ($t_{NiFe}$=50 nm, $t_{Cu}$=200 nm), and curve 1212 corresponds to the solid copper core conductor. By increasing the number of layers N while keeping the same ratio r, the frequency where the minimum resistance occurs, does not shift much. The higher number of thinner layers exhibits more effective macroscopic eddy current cancelling with the resultant resistance being smaller in the frequency range of operation.

Figure 13:
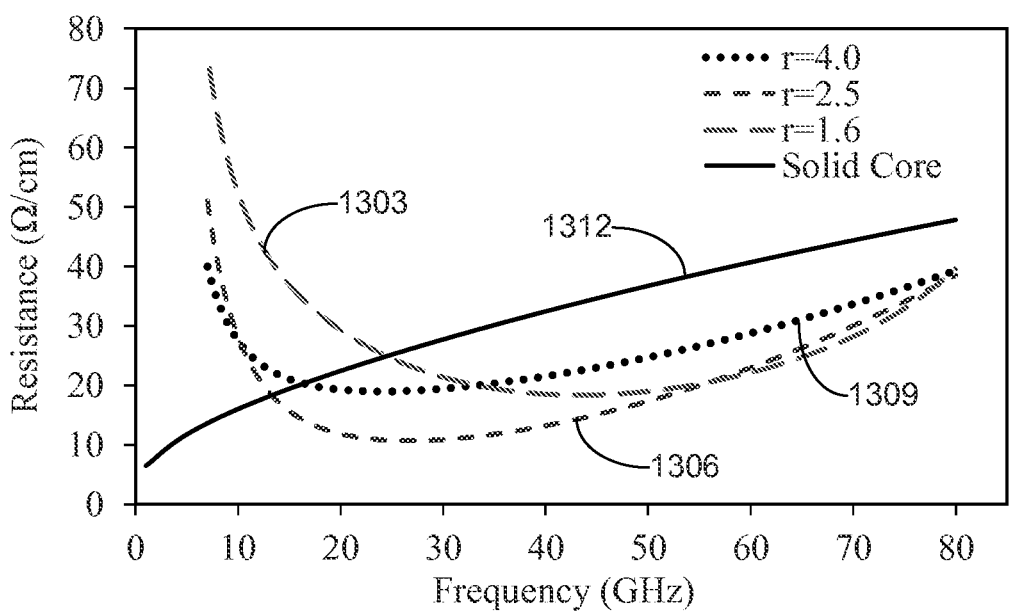

In order to utilize the RSV structures in higher frequencies, ferromagnetic materials with higher saturation magnetization and higher $f_{MR}$ frequency can be utilized. By using these ferromagnetic materials, the eddy current cancelling will occur at a higher frequency and the overall system can be designed for higher frequency ranges. FeCo is considered as a good candidate magnetic material that has a high $f_{MR}$ and can be deposited using standard processes allowing operation at higher frequencies (above 30 GHz). FIG. 13 depicts the simulation results of the resistance spectra of the RSV's consisting of Cu/FeCo layers that are performed up to 80 GHz. The overall diameter of the RSV structures and the solid conductor was kept the same (7 μm thick) with a constant $t_{FeCo}$=50 nm. Curve 1303 corresponds to r=1.6 (N=21, $t_{Cu}$=80 nm), curve 1306 corresponds to r=2.5 (N=16, $t_{Cu}$=125 nm), and curve 1309 corresponds to r=4.0 (N=11, $t_{Cu}$=200 nm). Curve 1312 corresponds to a solid copper core conductor, for comparison.

Figure 14:
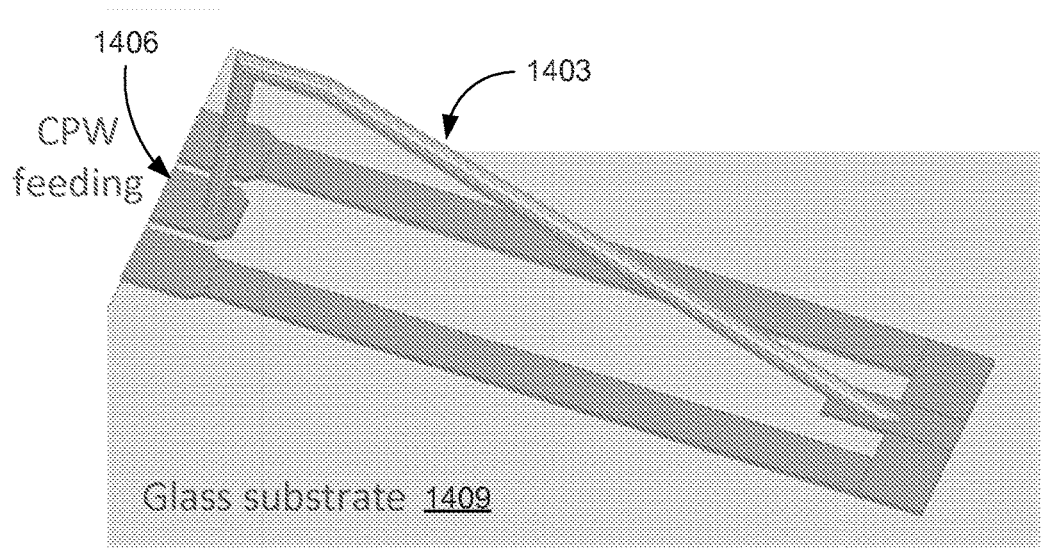
FIG. 14 is a schematic diagram of an example of a CRS conductor (or single turn inductor) in accordance with various embodiments of the present disclosure.

In order to verify the performance of the CRS and RSV structures, a CRS superlattice structure was fabricated on a radial conductor. Referring to FIG. 14, shown is a schematic diagram of an example of a CRS conductor 1403. The CRS conductor 1403 was fabricated using a radial gold wire that was implemented using a commercial wire bonder and a one-port coplanar waveguide (CPW) input 1406. The equivalent circuit of the CRS conductor 1403 is illustrated in FIG. 8 where port 1 is the CPW input 1406 and port 2 is grounded. The CRS conductors 1403 were fabricated on a glass substrate 1409 using a gold wire with a diameter of 28 μm as the structural core, followed by multiple-step electroplating of NiFe/Cu layers. Due to the radial shape of the structures, electroplating has been selected as the thin film deposition technique to ensure uniformity. The CRS conductors 1403 may also be considered single turn air-lifted inductors.

Figure 15:
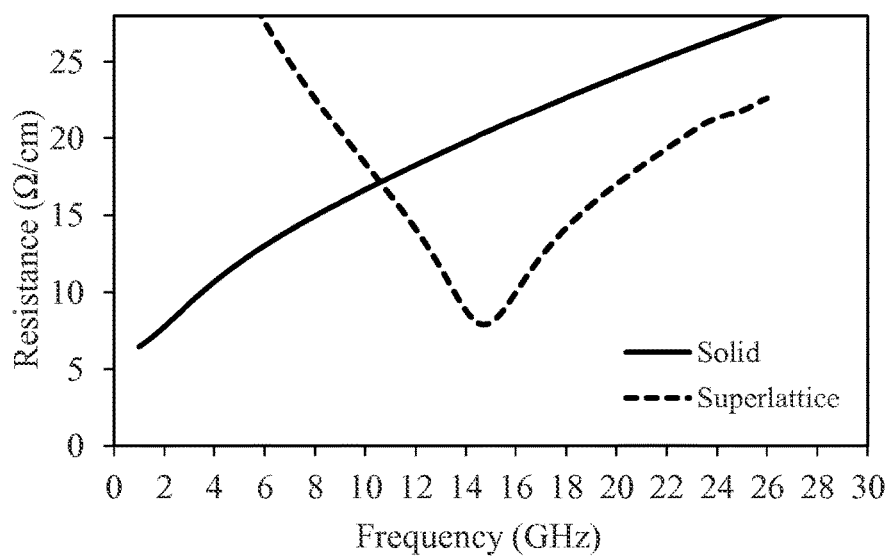
FIG. 15 is a graphical representation of an example of simulation results for the CRS conductor of FIG. 14 in accordance with various embodiments of the present disclosure.

The CRS conductors have been analyzed by performing the full-wave simulations using the high frequency structure simulator (HFSS, ANSYS Inc.) that illustrated the effectiveness of the CRS structure 100 (FIGS. 1A and 1B) for conductor loss reduction. A 10 μm-length unit cell of the CRS conductor included a solid core conductor 106c (FIGS. 1A and 1B) covered by laminated superlattice structures 103 and 106 (FIGS. 1A and 1B), where a ground plane was used underneath the structure, to allow propagation of transverse electromagnetic (TEM) waves. The lumped element equivalent circuit model of FIG. 8 was used to extract the conduction resistance of the conductor. FIG. 15 shows the resistance of the conductor unit cell where $r=t_{Cu}/t_{NiFe}=2.5$. The minimum resistance spectra occurs when $\mu_{eff}=0$ which will be satisfied when $\mu_{NiFe}=-2.5$ as expected from FIG. 2A. The simulation results reveal an ohmic loss reduction of about 3 times compared to the solid-core conductor at the target frequency of 15 GHz. For frequencies above 10 GHz, the resistivity of the superlattice structure falls below that of the solid-core conductor which leads to a relatively wide bandwidth where eddy current cancelling is effective.

Simulation results at 15 GHz for the current distribution throughout the CRS conductor 1403 were consistent with those shown in FIG. 11A. The current distribution for the solid core conductor made of copper were consistent with those shown in FIG. 11B. Due to the more uniform current distribution at the operation frequency in the CRS conductor 1403, the ohmic loss was significantly reduced.

Thin film permalloy and copper were used as the magnetic and non-magnetic metals, respectively, to create the CRS structure where both are electroplated using our in-house solution baths. The fabrication starts with a glass substrate 1409; after the deposition of the seed layers (Ti/Cu/Ti), the pads are patterned on the glass substrate 1409 followed by 10 μm electroplating of Cu. Then, the low-temperature gold wire bonding was immediately performed in order to avoid oxidation of the copper, which would require another metal layer on top of the copper for the sake of wire bonding. Electroplating was selected as the low cost, manufacturing method for the deposition of magnetic/non-magnetic nanoscopic thin films on the radial-shaped gold core conductors to ensure conformal coating. Most other processes including DC sputtering would be more expensive and may not work best for the radial-shape devices. Alternating layers of Cu and NiFe were electroplated on the gold wire core. After performing the multiple-step electroplating of NiFe/Cu, the CRS conductors 1403 are released by etching the seed layers. The table of FIG. 16 shows the utilized solution bath for the deposition of permalloy ($Ni_{80}Fe_{20}$) thin films.

FIGS. 17A-17C show pictures of the fabricated CRS conductors 1403 (or single-turn air-lifted CRS inductors). Arrays of conductors with different dimensions are shown in FIG. 17A. Conductors of different lengths but the same pad size were fabricated on the substrate. FIGS. 17B and 17C shown CRS conductors of 1 mm and 2 mm lengths after electroplating. The backbone wire was implemented using a gold wire bonder. The solid core conductors were also fabricated using a single layer of copper with the same thickness as the superlattice multilayers.

Figure 18A:
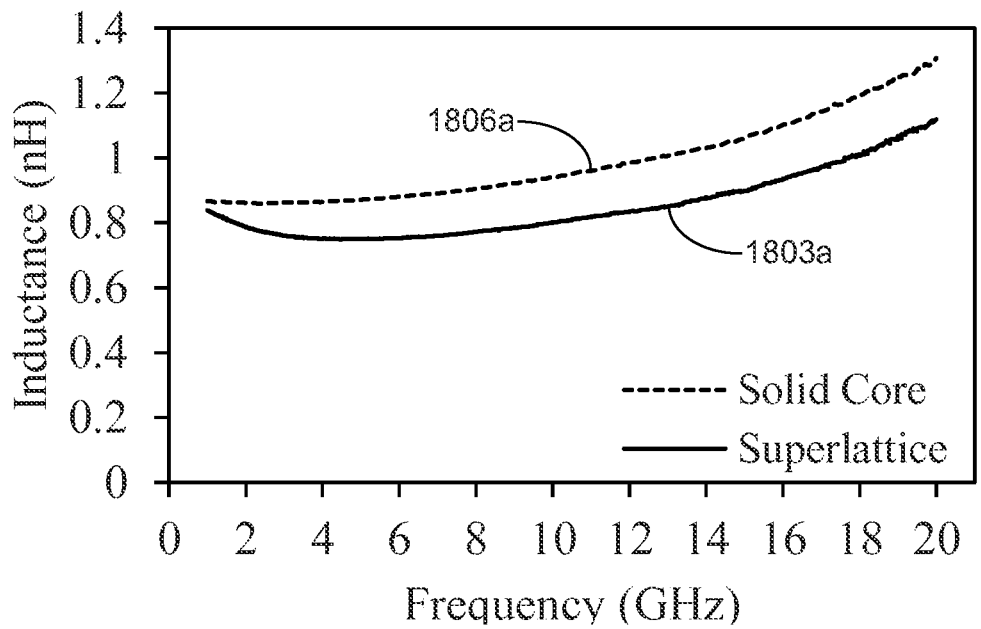
FIGS. 18A-20B are graphical representations of examples of measured results for the CRS conductors of FIGS. 17A-17C in accordance with various embodiments of the present disclosure.
Figure 18B:
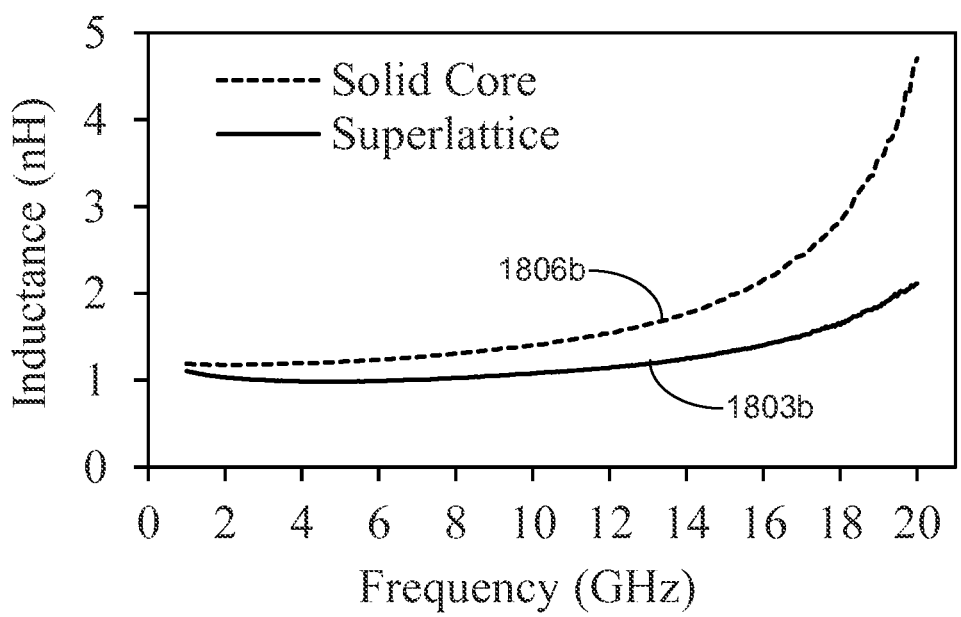

FIGS. 18A through 20B show the measurement results of the implemented CRS conductors (or inductors) 1403 where regular (solid core) wire conductors are also measured as control devices for comparison. The measurement results of two sets of CRS conductors 1403 with different lengths but a conformal deposition of 21 layers of NiFe/Cu (160 nm/400 nm) layers are presented. Multiple Ni and Cu targets facing the substrate inside the electroplating bath were used for a uniform deposition of both NiFe and Cu around the radial-shape conductors. The inductance and resistance of the CRS conductors 1403 were determined after analyzing the one-port Y-parameters. Referring to FIGS. 18A and 18B, the measured inductance values of the 1 mm and 2 mm CRS conductors (curves 1803a and 1803b), respectively, and solid-core conductors (curves 1806a and 1806b) were graphed. The inductance values of both are in the same range while the solid-core conductors (curves 1806) show slightly higher inductance values compared to CRS conductors (curves 1803). The distance between the probe and the ground was 1 mm for FIG. 18A and 2 mm for FIG. 18B.

Figure 19A:
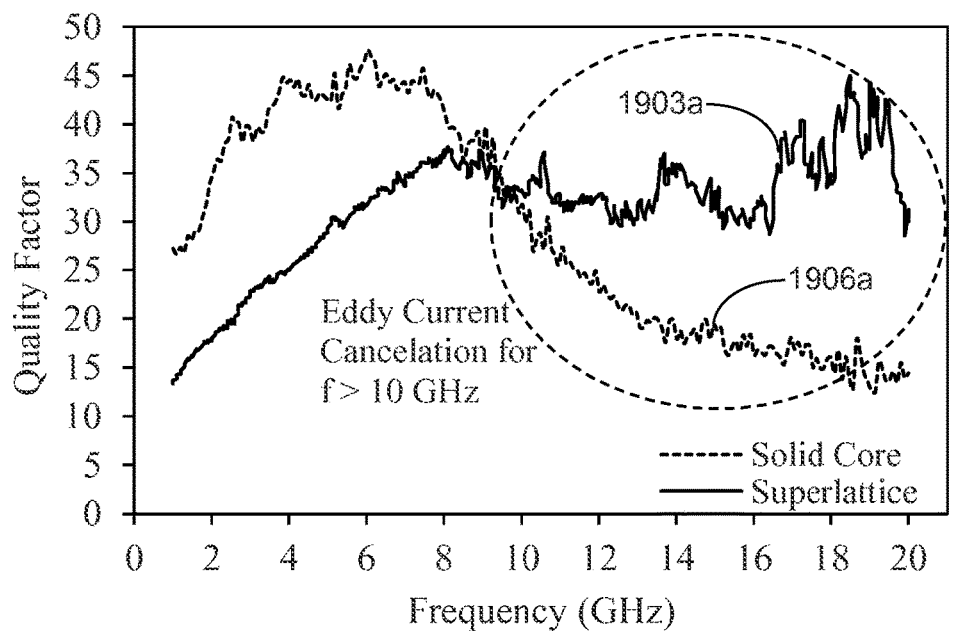
Figure 19B:
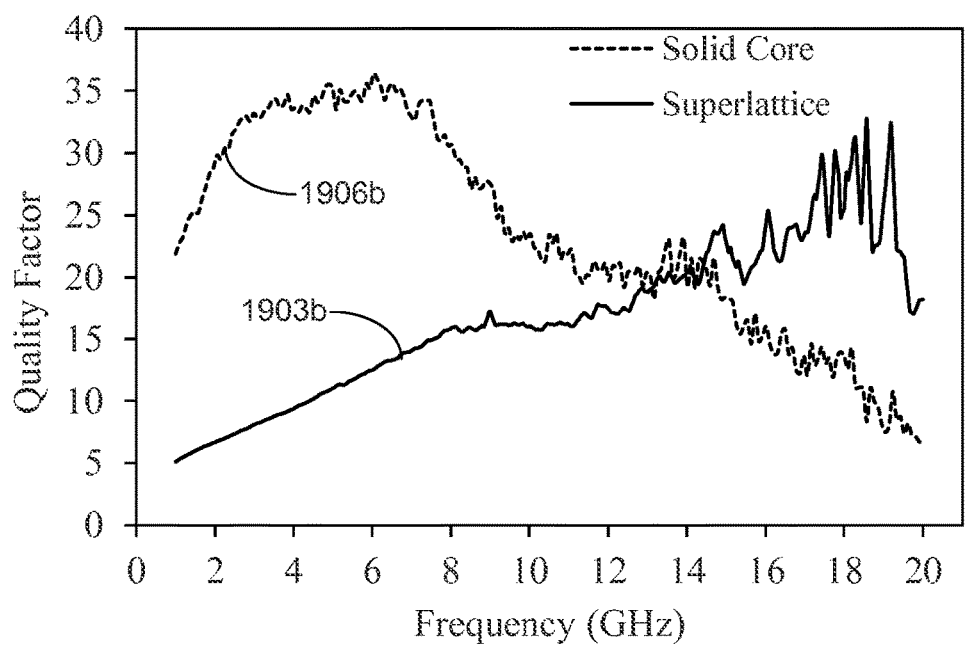

FIGS. 19A and 19B show the measured quality factor (Q-factor) of the implemented CRS conductors. The measured Q-factors of the solid-wire (curves 1906a and 1906b) and of the 1 mm long superlattice-wire conductors (or inductors) (curve 1903a) are shown in FIG. 19A and of the 2 mm long superlattice-wire conductors (or inductors) (curve 1903b) are shown in FIG. 19B. As predicted in FIG. 15, the resistance of the CRS conductor 1403 is lower than that of the solid-wire one in the range of 10-24 GHz. The ohmic resistance of the single layer copper constantly increases with the frequency due to the skin effect. As shown in FIG. 15, the ohmic resistance of the CRS conductors (or inductors) 1403 is higher than that of the solid-wire conductors in frequencies below 10 GHz; however, it starts to fall below the resistance of solid-wire inductors for frequencies above 10 GHz.

A higher Q-factor is achieved for the 1 mm CRS conductors at 10-20 GHz in FIG. 19A and for the 2 mm CRS conductors at 14-20 GHz in FIG. 19B, illustrating the effectiveness of eddy current cancellation for the CRS conductors 1403. Using single-layer solid-wire devices, the Q-factor continuously decreases for the frequencies above 10 GHz. Therefore, the Q-factor of the CRS inductors is higher compared to that of the solid-wire inductors in the operational frequency range of 10 GHz<f<20 GHz. Therefore, the CRS conductor provides a solution to the high resistivity and low Q-factor of RF passive devices originating from the skin effect. By changing the thickness ratio $r=t_{Cu}/t_{NiFe}$, the minimum resistance spectra point can be tuned, making it possible to avoid the skin effect problem and design low loss passive devices operating in an desired frequency range.

Figure 20A:
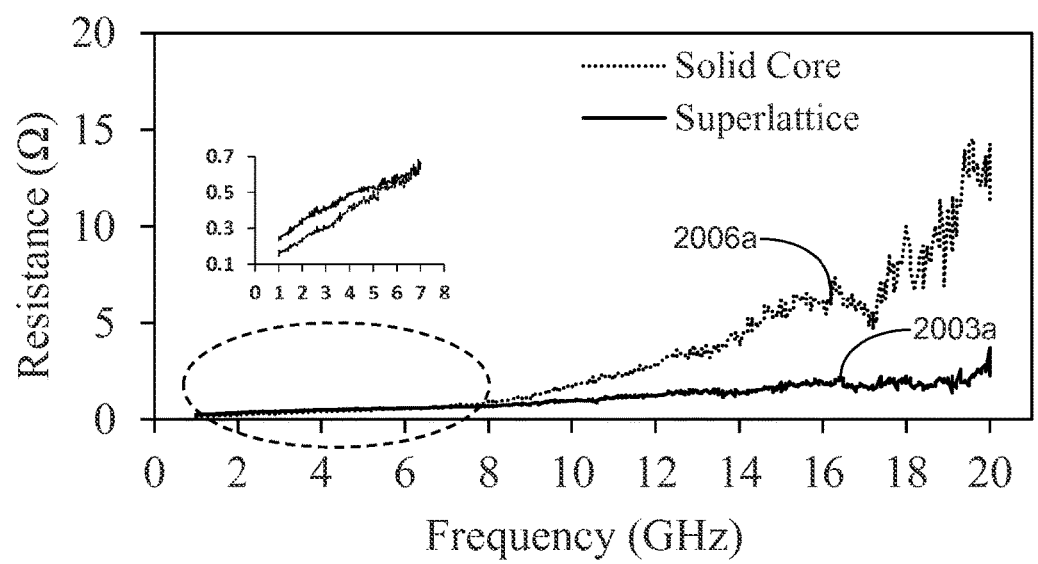
Figure 20B:
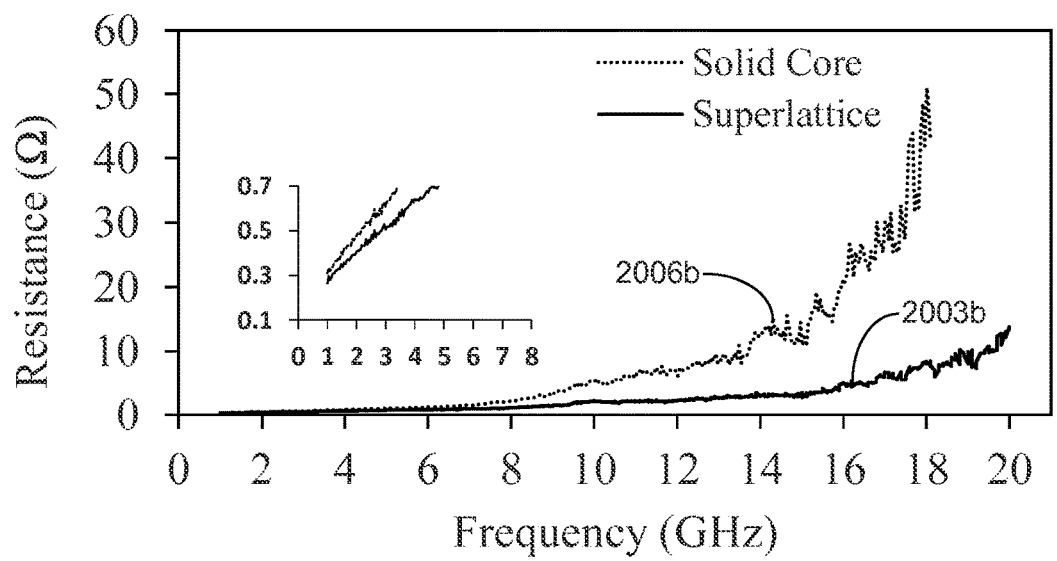

FIGS. 20A and 20B show a comparison of the measured resistance of the 1 mm CRS conductors (curve 2003a) and 2 mm CRS conductors (curve 2003b), respectively. The resistance of the solid core conductor is provided as curves 2006a and 2006b for comparison. The CRS conductors 1403 have higher resistance in low frequency range due to the high permeability of NiFe thin films in that frequency range, which makes the skin depth smaller (see EQN (1)) and increases the ohmic loss. However, as the frequency increases, the total CRS resistance is kept below that of solid wire devices and a wide-band of operation is achieved.

Superlattice structures consisting of ferromagnetic/non-ferromagnetic metals can be used to create high performance conductors for radio frequency (RF) transmission lines, low loss vias in CMOS and through silicon/glass via (TSV/TGV) structures, and other structures (e.g., inductors, antennas, resonators, etc.), whose ohmic resistance and RC delays have been greatly reduced. Two permalloys of $Ni_{80}Fe_{20}$ and FeCo were studied as the ferromagnetic materials with low and high magnetization saturation that can be used for designing superlattice structures with low and high GHz frequency ranges, respectively. The effects of design parameters including the number of layers and thickness ratio of the superlattice structures were examined. A radial superlattice structures including NiFe/Cu layers were implemented and their resistance compared with control solid-core devices made of copper; illustrating the effectiveness of the radial superlattice structure for reducing the RF loss. CRS conductors made of alternating magnetic/non-magnetic layers grown on a radial conductor operating in the microwave range was discussed. The CRS structure forces the high frequency current to flow through the volume of the conductor by suppressing the generated eddy currents inside the conductor which will lead to reduction of the conductor loss. A microwave inductor made of the CRS conductor was demonstrated and shown to have a Q-factor of 45 at 18 GHz, which may be attributed to low conductor and dielectric losses.

The theoretical and simulation results show a significant reduction in the conductor loss of vias in microelectronic structures including TSVs/TGVs. Magnetic materials with smaller magnetic saturation ($M_s$) such as NiFe have lower $f_{MR}$ and are suitable for lower frequency ranges, which can be utilized in applications such as digital microprocessors. NiFe and FeCo can be used as the ferromagnetic materials for low and high frequency operation, respectively, while electroplated Cu can be used as a non-ferromagnetic conductor material. The effect of the number of layers for the superlattice structure and the characteristics of the vias using different materials for a number of frequency ranges were examined. The fabrication of the superlattice structure is fully compatible with the standard MEMS and CMOS processes. Therefore, the integration of the CRS structure with current microfabrication processes is extended to a long-term solution for maximally reducing the loss in high-speed and radio frequency (RF) devices ranging from analog, digital and mixed signal applications in digital microprocessors, analog-to-digital converters to RF inductors, antennas and metamaterials.

The experimental implementation of CRS conductors and one of their potential applications as a high Q-factor inductor was demonstrated. The proposed inductors benefit from the cylindrical radial shape of the conductors which has a closed boundary condition in a radial direction with no fringing effects and therefore is considered more appropriate for eddy current suppression. The simulation and measurement results on the reduction of the conductor loss were verified. The highest Q-factor Ku band inductor showed a Q-factor of 45 at 18 GHz, where the high Q-factor may be attributed to the low dielectric loss from the air-lifted architecture and the low conductor loss from the CRS conductor. Besides high Q-factor inductors, the CRS structure may be extended to low loss passive devices including coaxial transmission lines and antennas. The fabrication method is fully compatible with the standard MEMS and CMOS processes and therefore can be integrated with the current manufacturing processes for reducing the RF loss. In this work, NiFe with $f_{AR}$=28 GHz was used which limits the maximum frequency of operation to be smaller than $f_{AR}$; however, other ferromagnetic materials with a higher $f_{AR}$ can be used to design low loss passive devices in higher frequency ranges.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Therefore, at least the following is claimed:
1. A conductor, comprising:
   a plurality of radially distributed layers including:
      a non-permalloy core comprising a non-conductive material;
      a permalloy layer disposed on and encircling the non-permalloy core; and
      a non-permalloy layer disposed on and encircling the permalloy layer, the non-permalloy layer comprising a conductive material.
2. The conductor of claim 1, wherein the plurality of radially distributed layers comprises a plurality of permalloy layers alternating with a plurality of non-permalloy layers.
3. The conductor of claim 2, further comprising an insulation layer disposed on and encircling an outermost non-permalloy layer of the plurality of non-permalloy layers.
4. The conductor of claim 1, wherein the conductive material is aluminum or copper.
5. The conductor of claim 1, wherein the non-conductive material is a polymer.
6. The conductor of claim 1, wherein the permalloy layer comprises one of NiFe, FeCo, NiFeCo, or NiFeMo.
7. The conductor of claim 1, wherein the conductor is a coaxial cable, where the plurality of radially distributed layers form a central conductor.
8. The conductor of claim 1, wherein the conductor is included in one of an inductor, a transformer, an antenna, or a resonator.
9. A conductor, comprising:
   a plurality of radially distributed layers including:
      a non-permalloy core;
      a permalloy layer disposed on and encircling the non-permalloy core; and
      a non-permalloy layer disposed on and encircling the permalloy layer,
   wherein the non-permalloy core and the non-permalloy layer comprise a common non-permalloy material.
10. The conductor of claim 9, wherein the common non-permalloy material is selected from the group consisting of aluminum, copper, silver, and gold.
11. The conductor of claim 9, wherein permeability of the conductor is based upon an applied external magnetic field level.
12. A conductor, comprising:
   a plurality of radially distributed layers including:
      a non-permalloy core, wherein the non-permalloy core comprises a void containing air;

a permalloy layer disposed on and encircling the non-permalloy core; and a non-permalloy layer disposed on and encircling the permalloy layer.

13. The conductor of claim 12, wherein the plurality of radially distributed layers comprises a plurality of permalloy layers alternating with a plurality of non-permalloy layers.

14. The conductor of claim 13, further comprising an insulation layer disposed on and encircling an outermost non-permalloy layer of the plurality of non-permalloy layers.

15. A via interconnect, comprising:
a plurality of radially distributed layers extending through a substrate, the plurality of radially distributed layers including:
a non-permalloy core;
a permalloy layer disposed on and encircling the non-permalloy core; and
a non-permalloy layer disposed on and encircling the permalloy layer.

16. The via interconnect of claim 15, wherein the non-permalloy core and the non-permalloy layer comprise a common non-permalloy material.

17. The via interconnect of claim 16, wherein the common non-permalloy material is selected from the group consisting of aluminum, copper, silver, and gold.

18. The via interconnect of claim 15, wherein the non-permalloy core comprises a void containing air or a non-conductive material.

19. The via interconnect of claim 15, wherein the permalloy layer comprises one of NiFe, FeCo, NiFeCo, or NiFeMo.

20. The via interconnect of claim 15, wherein the substrate is a glass substrate, a silicon substrate, or an organic substrate.

* * * * *